США005311055A

United States Patent [19]
Goodman et al.

[11] Patent Number: 5,311,055
[45] Date of Patent: May 10, 1994

[54] TRENCHED BIPOLAR TRANSISTOR STRUCTURES

[75] Inventors: Alvin M. Goodman, Arlington; Max N. Yoder, Falls Church, both of Va.

[73] Assignee: The United States of America as represented by the Secretary of the Navy, Washington, D.C.

[21] Appl. No.: 796,553

[22] Filed: Nov. 22, 1991

[51] Int. Cl.$^5$ .................... H01L 29/72; C30B 23/00
[52] U.S. Cl. .................... 257/593; 257/584; 257/586; 257/590; 257/591; 257/592
[58] Field of Search .................. 357/34, 33, 50, 36; 257/584, 586, 590, 591, 592, 593; 156/610, 611, 612

[56] References Cited

U.S. PATENT DOCUMENTS

| | | | |
|---|---|---|---|
| 4,058,430 | 11/1977 | Suntola et al. | 156/611 |
| 4,746,626 | 5/1988 | Eda et al. | 437/107 |
| 4,881,111 | 11/1989 | Sanders | 357/34 |
| 4,887,144 | 12/1989 | Cook et al. | 357/50 |
| 4,896,203 | 1/1990 | Kajkawa | 357/34 |
| 4,931,132 | 6/1990 | Aspnes et al. | 156/601 |
| 4,949,145 | 8/1990 | Yano et al. | 357/34 |
| 4,963,957 | 10/1990 | Ohi et al. | 357/34 |
| 4,996,580 | 2/1990 | Kimura et al. | 357/34 |
| 5,053,847 | 10/1991 | Ito et al. | 357/36 |
| 5,082,798 | 1/1992 | Arimoto | 437/108 |
| 5,093,696 | 3/1992 | Kinashita | 357/17 |

FOREIGN PATENT DOCUMENTS 0219168  9/1988  Japan .

OTHER PUBLICATIONS

IBM Technical Disclosure Bulletin, "Surrounding-Collector Trench Bipolar Transistor with Minimized Base Resistance", vol. 34, No. 2, Jul. 1991.

Primary Examiner—Jerome Jackson
Assistant Examiner—Valencia M. Martin
Attorney, Agent, or Firm—Alfons Kwitnieski; Thomas E. McDonald; John G. Wynn

[57] ABSTRACT

Both homojunction and heterojunction bipolar transistor structures are fabricated in unique trenched configurations so as to better utilize their surface areas by employing both the vertical and horizontal portions of their base regions with equal effectiveness. An important advantage of the unique trenched configurations is that the base region of each trenched structure is of precisely the same thickness throughout—both vertical and horizontal portions. Consequently, the transit time for charge carriers to diffuse across the base region and the base transport factor are uniform because of the uniform base thickness. Moreover, the parasitic capacitance region of each trenched structure beneath base metallization contacts is only a small portion of the entire base-collector junction region. Accordingly, the RC time constant of each trenched structure is very low and the high frequency response gain of the heterojunction trenched bipolar transistor structure is an order of magnitude higher than its conventional heterojunction bipolar transistor counterpart.

19 Claims, 3 Drawing Sheets

TRENCHED BIPOLAR TRANSISTOR STRUCTURES

BACKGROUND OF THE INVENTION

1. Field of the Invention

The present invention relates to bipolar transistor structures, but more specifically, the present invention relates to homojunction and heterojunction trenched bipolar transistor structures.

2. Description of the Prior Art

Silicon bipolar transistors are produced by a highly evolved, long established and well known technology. FIG. 1 is a generalized isometric/schematic cross-section view of a conventional homojunction silicon bipolar transistor (SBT) structure 10 which can be fabricated by this technology. The conventional homojunction SBT structure 10 comprises a base region 12 sandwiched between an emitter region 14 and a collector region 16. An active region 18 of the conventional homojunction SBT structure 10 is that area directly beneath the emitter region 14 as bounded by the dotted lines 20. The active region 18 is approximately equal to the area of the emitter region 14, which is of width w per unit length thereof. As shown, the depth d of the emitter region 14 is usually smaller relative to its width w. Thus, since the dimensions a and a' are greater than the dimension b of the base region 12, beneficial contribution of the side areas, i.e., 2 d per unit length, to the active operation of the emitter region 14 is negligible. In fact, none of the other portions of the conventional homojunction SBT struction 10 beneficially contribute to its active operation. For example, the base-to-collector junction 22, which interfaces the base region 12 and collector region 16, creates an unwanted base-to-collector parasitic capacitance. This unwanted base-to-collector parasitic capacitance lies in the horizontal and vertical planes of the base-to-collector junction 22 to the right and to the left of the dotted lines 20, outside the active region 18, i.e., the parasitic region.

Still referring to the conventional homojunction SBT structure of FIG. 1, to minimize the unwanted base-to-collector parasitic capacitance, the dimensions a, a' and b of the base region 12 should be equal. However, as illustrated in FIG. 1, in practical application, the dimensions a and a' of the base region 12 must be of sufficient width to permit metallization of the surfaces of base ohmic contacts (not shown). In addition, the width w of the emitter region 14, which translates into the width of the active region 18, and, accordingly, the beneficial width of the base-to-collector junction 22, must be kept small to minimize the effective base resistance. Thus, in actual practice, the parasitic region typically exceeds that of the active region 18. This results in the dimensions a and a' being much larger than the dimension b. Hence, the ideal conventional homojunction SBT structure 1 and its above mentioned practical counterpart does not utilize its volume in the most effective and efficient manner.

OBJECTS OF THE INVENTION

Accordingly, a principal object of the present invention is to configure an improved bipolar transistor structure wherein its volume, and, accordingly, its active region is better utilized by employing both the horizontal and vertical portions of its base region with equal effectiveness and efficiency, thereby substantially eliminating the unwanted parasitics of the base region.

An important object of the present invention is to configure the improved bipolar transistor structure so that its emitter, base and collector regions are recessed into a trench, wherein its base region is precisely the same thickness throughout both its horizontal and vertical portions thereby creating a homojunction trenched bipolar transistor structure.

A corollary object of the foregoing object is to reduce the parasitic region of the homojunction trenched bipolar transistor structure to a relatively small portion thereof such that both the horizontal and vertical portions of the base region can inject charge carriers with equal effectiveness and efficiency because of the substantial reduction of the base-to-collector parasitic capacitance.

Yet another important object of the present invention is to create an insulating region intimate to the collector region, proximate to and beneath the base region and underlying the base region metallization of the homojunction trenched bipolar transistor structure, thereby substantially reducing the remaining base-to-collector parasitic capacitance.

Still another important object of the present invention is to further improve the homojunction trenched bipolar transistor structure by fabricating its base region of group IV elemental semiconductor materials and fabricating its emitter region to contain a pseudomorphic layer of a higher bandgap material, thereby creating a heterojunction trenched bipolar transistor structure having a large emitter region injection efficiency notwithstanding the base region being highly doped.

SUMMARY OF THE INVENTION

In accordance with the above stated objects, other objects, features and advantages, the present invention has as a primary purpose to change the basic configuration of the conventional homojunction SBT structure to create first an improved homojunction bipolar transistor structure and then an even further improved heterojunction bipolar transistor structure wherein performance in the higher frequency ranges is increased by an order of magnitude over the conventional homojunction SBT structure.

The essence of the present invention is in configuring each of the improved homojunction and heterojunction bipolar transistor structures to better utilize its volume by employing both the horizontal and vertical portions of its base region with equal effectiveness and efficiency.

The primary purpose of the present invention is carried out by configuring each of the improved homojunction and heterojunction bipolar transistor structures so that its emitter, base and collector regions are recessed into a trench. The salient feature of this trench approach is that the base region is of precisely the same thickness throughout—both horizontal and vertical portions. Thus, the transit time for charge carriers to diffuse across the base region and the base transport factor are uniform because of the uniform thickness of the base region. In the homojunction and heterojunction trenched bipolar transistor structures, according to the present invention, virtually all regions/portions thereof are active.

In fabricating either the homojunction or heterojunction trenched bipolar transistor structure, an n-type collector region is formed into a p-type starting material substrate in accordance with an n-well pattern. For a particular substrate, thousands of structures would be configured simultaneously. The n-type collector region of any one structure, after further processing, will comprise a pair of adjacent collector ohmic contacts. Between the pair of adjacent collector ohmic contacts, a trench is symmetrically formed in the collector region. From this point forward in the fabrication process, either a homojunction or heterojunction trenched bipolar transistor structure can be completed.

To continue to completion of a homojunction trenched bipolar transistor structure, a $p^+$-type material is used to grow a base region uniformly upon the bottom and vertical sidewalls of the trench and the upper horizontal surface of the collector region. A modified atomic layer epitaxial (ALE) growth method (to be discussed hereinafter in the Section entitled, "Description of the Preferred Embodiments"), also termed ALE extraction/exchange method, is used to grow the base region to ensure the required uniformity in thickness. The ALE extraction/exchange method is also used to grow an emitter region uniformly upon the bottom and vertical sidewalls of the trench and the upper horizontal surface of the collector region contiguous to the base region. An $n^{++}$-type material is used to grow the emitter region.

Use of the trenched structure substantially reduces the parasitic capacitance between the base and collector regions. To further reduce the remaining parasitic capacitance, the portion of the collector region beneath what is normally the base metallic contacts is rendered insulating. Finally, an emitter, base and collector metallization pattern is defined, and metallization to provide emitter, base and collector metal contacts for the homojunction bipolar transistor structure is completed.

In its fabrication, the heterojunction trenched biopolar transistor structure is different from the above-mentioned homojunction version in two ways. First, the $p^+$-type material used for deposition of the base region is more heavily doped. And second, an $n^{++}$-type higher bandgap material such as non-stoichiometric silicon carbide is used to grow a pseudomorphic layer for the emitter region. In applications where the pseudomorphic layer is not thick enough to allow successful metallization of the emitter region, a second layer ($n^{++}$-type material) is deposited upon the pseudomorphic layer. All of the above deposition operations are performed using the ALE extraction/exchange method previously mentioned. From this point on, the fabrication steps are the same for both the homojunction and heterojunction trenched bipolar transistor structures, according to the present invention.

BRIEF DESCRIPTION OF THE DRAWINGS

The previously stated objects, other objects, features and advantages of the present invention will be apparent from the following more particular description of the preferred embodiments as illustrated in the accompanying drawings, in which.

DESCRIPTION OF THE PREFERRED EMBODIMENTS

Figure 1:
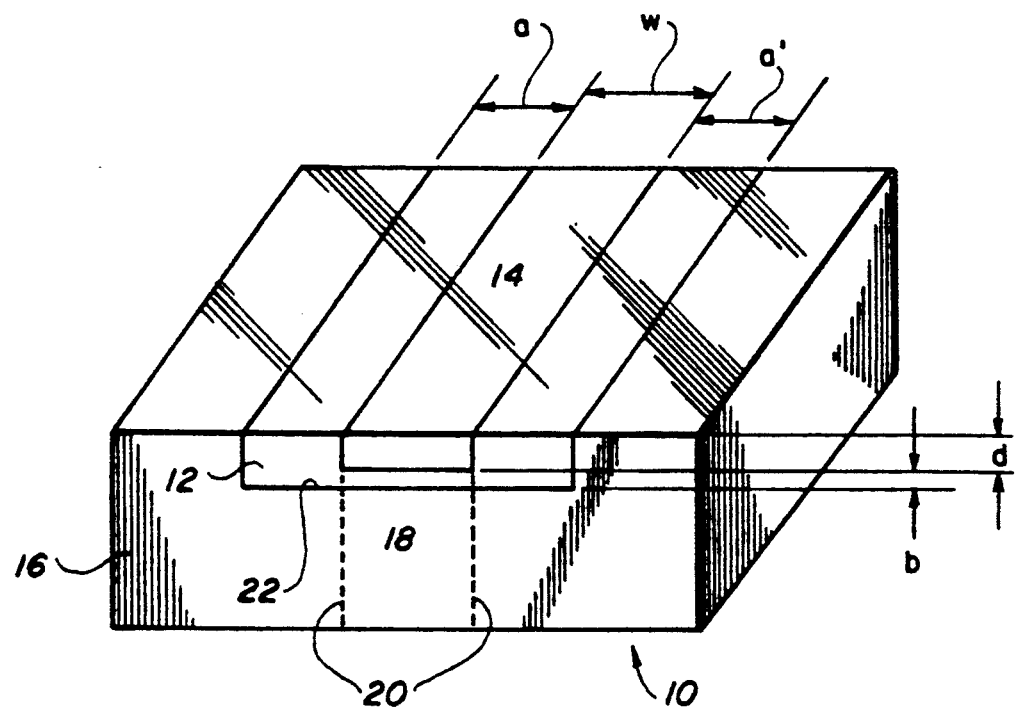
FIG. 1 is a generalized isometric/schematic cross-section view of a conventional homojunction silicon bipolar transistor (SBT) structure.

The conventional SBT structure 10 shown in FIG. 1, and previously described in the "Background of the Invention" Section of the present application, can be improved by recognizing that because of its configuration, the volume of the conventional SBT structure 10 is not utilized in the most effective and efficient manner. The present invention provides an effective and efficient structure for a bipolar transistor. The description hereinafter will concentrate on the fabrication of n-p-n emitter up structures, but it should be realized that p-n-p emitter up structures, or collector up structures which are either n-p-n or p-n-p can be fabricated to take advantage of the present invention.

Figure 2:
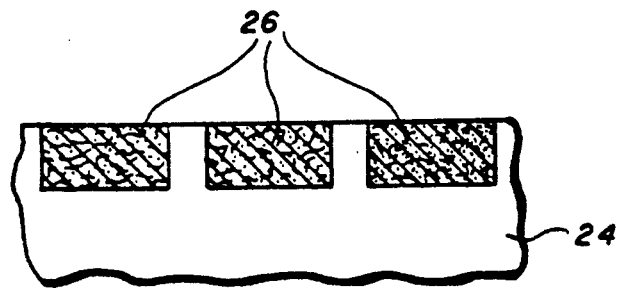
FIGS. 2–3 illustrate the essential initial process steps suitable for fabrication of either a homojunction or a heterojunction trenched bipolar transistor structure, according to the present invention.

As illustrated in FIG. 2, the process of fabricating an improved bipolar transistor structure(s) is started with a p-type silicon substrate 24. The p-type silicon substrate 24 comprises boron, aluminum, gallium or indium doped silicon wherein the dopant concentration is approximately $10^{14}$ atoms/cm$^3$ within the range of $10^{13}$ to $10^{16}$ atoms/cm$^3$. The preferred p-type dopant is boron. Then, the p-type silicon substrate 24 is sacrificially oxidized to form a silicon oxide (SiO$_2$) layer (not shown) of between 0.025 and 1.0 micron. The SiO$_2$ layer can be grown using conventional vapor deposition processes or by steam at 900 Celsius. Next, a photoresist is applied and exposed to define an n-well pattern. The photoresist is then developed to produce the n-well pattern. Next, phosphorus, arsenic or antimony is implanted through the SiO$_2$ layer into those areas defined by the n-well pattern, and, accordingly, will not be implanted in the areas where photoresist still exists. The photoresist and SiO$_2$ layer are stripped from the surface of the p-type silicon substrate 24 after which it is annealed at high temperature to activate the implanted phosphorus, arsenic or antimony ions to ensure that they reside on substitutional lattice sites of the p-type silicon substrate 24 rather than its interstitial sites, to remove ion implantation induced damage and to diffuse the implanted atoms to a depth greater than about 5.0 to 10.0 microns. The result of the foregoing process steps is a plurality of n-type silicon wells/collector regions 26 in the p-type silicon substrate 24. The n-type silicon wells/collector regions 26 comprise phosphorus, arsenic or antimony doped silicon wherein the dopant concentration is approximately $5 \times 10^{17}$ atoms/cm$^3$ within the range of $10^{16}$ to $10^{18}$ atoms/cm$^3$. The preferred n-type dopant is phosphorus. The reason for this type of processing is to electrically separate the structures to be fabricated.

Figure 3:
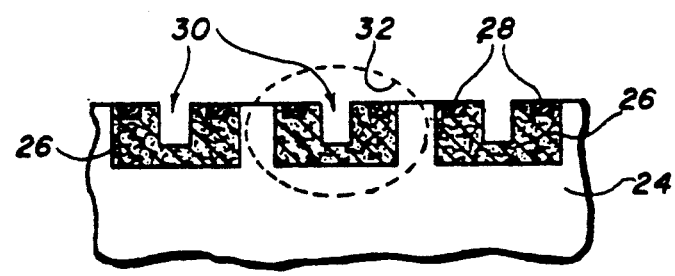

Referring now to FIG. 3, the next step in the process is to apply and expose a photoresist to define a collector contact pattern in each of the plurality of n-type silicon wells/collector regions 26. The photoresist is developed to produce the collector contact pattern(s). Next, phosphorus, arsenic or antimony is implanted in those areas defined by the collector contact pattern(s), and, thus, will not be implanted in the areas where photoresist still exists. The photoresist is stripped from the surfaces of the p-type silicon substrate 24 and the plurality of n-type silicon wells/collector regions 26 after which the surfaces are annealed, this time, to activate the implanted phosphous, arsenic or antimony ions to ensure that they reside on substitution lattice sites of the plurality of n-type silicon wells/collector region 26. The result of these process steps is a pair of n++ collector ohmic contacts 28 disposed adjacent and parallel to each other on the surface of each of the plurality of n-type silicon wells/collector regions 26 proximate to adjacent and parallel edges thereof. The n++ collector ohmic contacts 28 comprise phosphorus, arsenic or antimony doped silicon wherein the dopant concentration is approximately $10^{20}$ atoms/cm$^3$ within the range of $3 \times 10^{19}$ to $10^{21}$ atoms/cm$^3$. Again, the preferred n-type dopant is phosphorus.

Still referring to FIG. 3, the top surfaces of the p-type silicon substrate 24, the plurality of n-type silicon wells/collector regions 26 and each of the pairs of adjacent n++ collector ohmic contacts 28 are sacrificially oxidized to form a SiO$_2$ layer (not shown). Next, a photoresist is applied and exposed to define a trench pattern. The photoresist and the SiO$_2$ layer are selectively developed/removed to produce the trench pattern. According to the aforementioned trench pattern, a plurality of trenches 30 are cut, i.e., conventionally etched into corresponding ones of the plurality of n-type silicon wells/collector regions 26 symmetrically between each pair of adjacent n++ collector ohmic contacts 28 thereof. The plurality of trenches 30 are formed by a reactive ion etching (RIE) process, which uses, for example, a plasma of argon and carbon tetrafluoride (CF) or carbon tetrachloride (CCl$_4$). Depending on the intensity of the plasma, the etching rate for cutting of the plurality of trenches 30 will be about 0.20 microns (2000 Angstroms) per minute. For purposes of the present invention, the plurality of trenches 30 are etched within a predetermined range to a depth of 5.0 to 10.0 microns and a width of 1.0 to 2.0 microns, depending on design considerations such as power bandwidth ratios. Thus, the preferred configuration is rectilinear.

Figure 4:
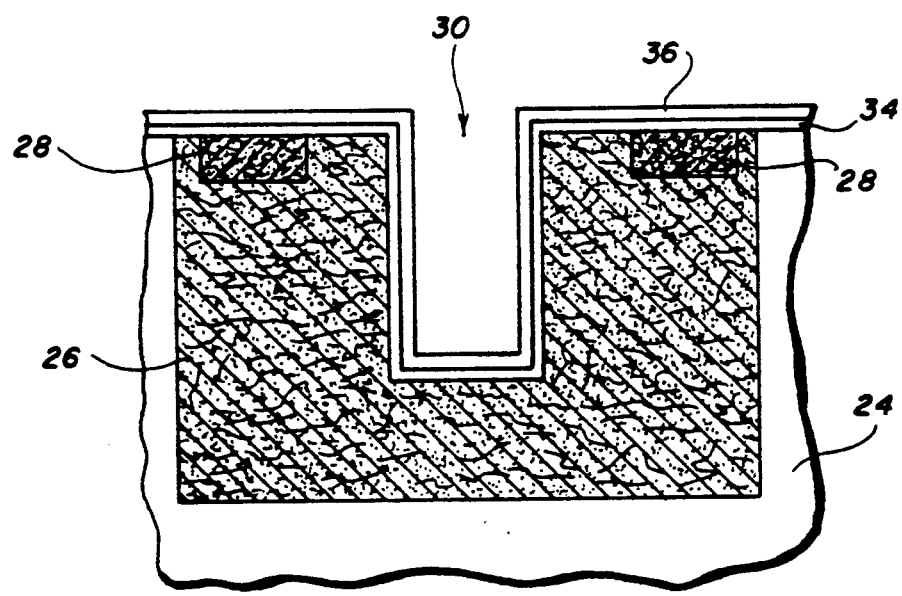
FIGS. 4–5 illustrate the essential process steps, following the process steps of FIGS. 2–3, suitable for completing the fabrication of the homojunction or the heterojunction trenched bipolar transistor structure of FIGS. 2–3, according to the present invention.

FIG. 3 depicts three identical structures of potentially thousands of identical structures. For in the normal manufacturing of silicon bipolar transistor structures, thousands of them are fabricated concurrently on a single substrate or wafer. Up to this point in the process, the identical structures of FIG. 3 can be further processed to fabricate either a homojunction or a heterojunction trenched bipolar transistor structure. To further illustrate fabrication of a homojunction structure, according to the present invention, a single structure shown within the dotted circle 32 is enlarged, as shown in FIG. 4, to better depict the fabrication of, first, a base region 34, and, second, an emitter region 36. To make clear, when the base region 34 and the emitter region 36, on either side of the junction therebetween, consist of semiconductor materials having substantially the same chemical composition except for doping, e.g., p silicon on n silicon, the transition is termed a homojunction. On the other hand, when the semiconductor materials have different chemical compositions, e.g., silicon carbide (emitter region) on silicon (base region), the transition is termed a heterojunction.

Referring then to FIG. 4, the base region 34 and the emitter region 36 are grown by a modified atomic layer epitaxial (ALE) growth method also termed the ALE extraction/exchange method. The reason why this ALE extraction/exchange method is used is because it is the only method known wherein the uniformity of the growth thickness is independent of the crystallographic orientation of the growth surface, i.e., the faces of the trench 30. In FIG. 4, the crystallographic orientation of the faces of the trench 30, in a counterclockwise direction, is [110], [100] and [1$\bar{1}$0]. In any other known technique, the [100] and [1$\bar{1}$0] faces would grow at different rates. For example, if an attempt was made to grow the base region 34 by molecular beam epitaxy (MBE), there would be growth on the [100] face (the bottom of the trench 30), but virtually no growth on the [110] and [1$\bar{1}$0] faces (the sides of the trench 30). In another example, if an attempt was made to grow the base region 34 by chemical vapor deposition (CVD), there would be growth on all of the faces, i.e., the [110], [100] and [1$\bar{1}$0] faces, but at unequal rates. Therefore, the use of these conventional growth methods would produce an uneven thickness of the base region 34, which is an undesirable result. Contrariwise, the aforementioned ALE extraction/exchange method allows growth of these faces ([110], [100] and [1/0]) at the same rate, and, accordingly, with the same uniformity and thickness. This ALE extraction/exchange method is used in the fabrication of both the homojunction and heterojunction trenched bipolar transistors, according to the present invention. The method is described in a U.S. Pat. No. 5,225,366 by Max N. Yoder, entitled "An Apparatus for and a Method of Growing Thin Films of Elemental Semiconductors," U.S. Ser. No. 07/541,990, filed on Jun. 22, 1990, issued on Jul. 7, 1993 and assigned to the same assignee as the present application. The teachings of the foregoing Patent by Yoder are incorporated herein by reference.

To continue with the fabrication of the homojunction structure and still referring to FIG. 4, the surfaces of the p-type silicon substrate 24, the n-type collector region 26, the n++ collector ohmic contacts 28 and the trench 30 are cleaned using a light etching process. Then the ALE extraction/exchange method is used to grow the base region 34 of p+ silicon to a uniform thickness typically of about 500 Angstroms to within one atomic layer or about 4.5 Angstroms. The p+ silicon comprises boron, aluminum, gallium or indium doped silicon wherein the dopant concentration is approximately $10^{18}$ atoms/cm$^3$ within the range of $10^{17}$ to $10^{19}$ atoms/cm$^3$. As previously mentioned, the preferred p-type dopant is boron. The use of the ALE extraction/exchange method ensures that the base region 34 is grown uniformly and contiguously upon the collector region 36 on its upper horizontal surface, and on its vertical sidewalls and lower horizontal surface comprising the trench 30. Also as shown, the inside and outside corners of the trench 30 do not short through or contain other imperfections.

In the next step of the process, the ALE extraction/exchange method is also used to grow the emitter region 36 of n++ silicon to a uniform thickness typically of about 1000 Angstroms. The n++ silicon comprises phosphorus, arsenic or antimony doped silicon wherein the dopant concentration is approximately $10^{20}$ atoms/cm$^3$ within the range of $10^{19}$ to $10^{21}$ atoms/cm$^3$. As previously mentioned, the preferred n-type dopant is phosphorus. Here again, the ALE extraction/exchange method ensures that the emitter region 36 is grown uniformly (within one atomic layer or about 4.5 Angstroms) and contiguously upon the base region 34.

Although the structure of FIG. 4, as shown, has no parasitic capacitance regions of the base-collector interface, subsequent processing/delineation (to be discussed hereinafter) of the emitter region 36, metallization of the base region 34 and stripping of the base region overlying the n++ collector ohmic contacts 28 will create small, but unwanted, parasitic capacitance regions between the base region 34 and the collector region 26 unless means are taken to prevent same.

Figure 5:
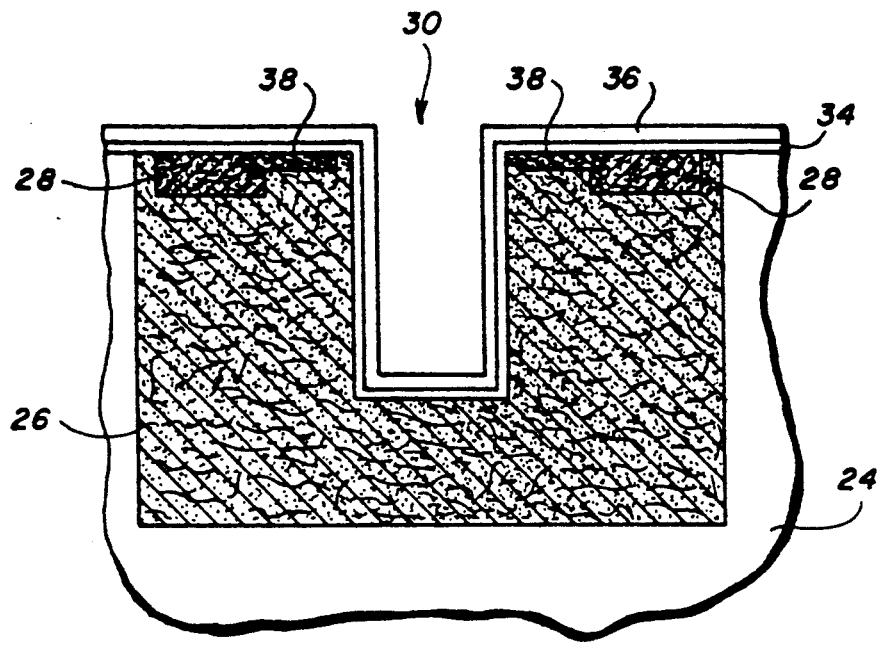

Referring now to FIG. 5, in order to further reduce the anticipated remaining parasitic capacitance regions, the portion of the collector region 26 between the n++ collector ohmic contacts 28 and the base region 34 must be rendered insulating. One method of accomplishing the foregoing is first to grow a thin sacrificial $SiO_2$ layer upon the emitter region 36. Then a photoresist is applied and exposed to define an oxygen implantation pattern. The photoresist and the $SiO_2$ layer are selectively developed/removed to produce the oxygen implantation pattern. Oxygen ions at a fluence of $10^{18}$ ions/cm$^2$ are then implanted through the emitter region 36 and base region 34, i.e., the upper horizontal region/layers thereof, into the above-mentioned portion of the collector region 26 as defined by the oxygen implantation pattern. The remaining photoresist and $SiO_2$ are then stripped from the emitter region 36 whereupon the structure of FIG. 5 is annealed at 950° Celsius for about 10 minutes to form a pair of buried silicon dioxide ($SiO_2$) areas 38. Because of the annealing temperature, the implanted oxygen ions will react with the n silicon of the collector region 26 to grow $SiO_2$. This implantation process is widely known by the acronym SIMOX (Separation by IMplanted OXygen). An alternative approach is to selectively thermally oxidize the areas characterized by the buried silicon dioxide area 38 prior to the growth of the base region 34.

Figure 6:
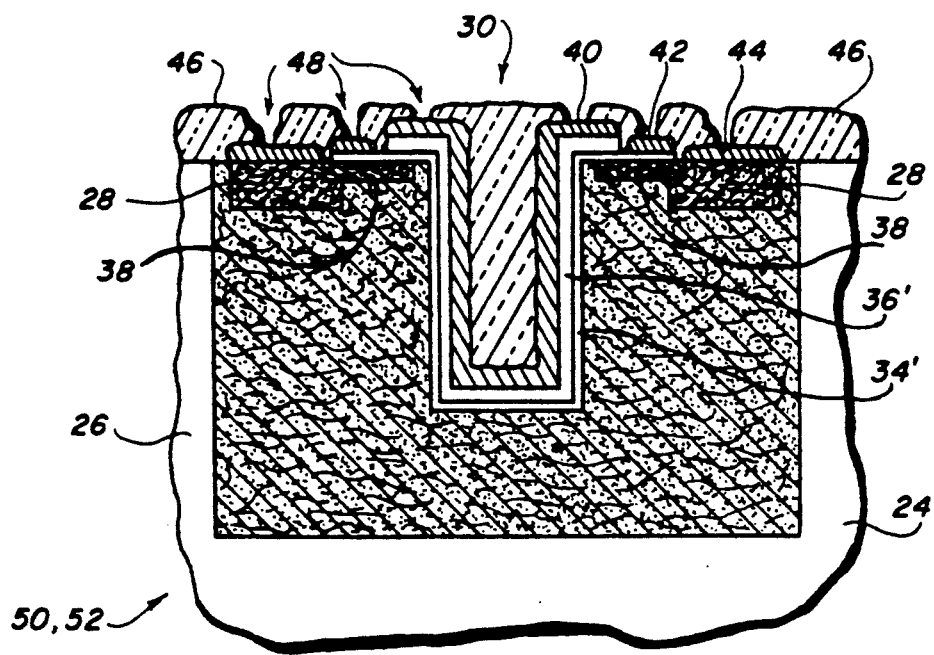
FIG. 6 illustrates the final process steps, following the process steps of FIGS. 4–5, and the completed homojunction or the heterojunction trenched bipolar transistor structure of FIGS. 4–5, according to the present invention.

Referring to FIGS. 5 and 6 as viewed concurrently, the fabrication of emitter, base and collector metal contacts 40, 42 and 44, respectively, for allowing electrical connections to be made to the corresponding emitter, base and collector regions 36, 34 and 26, and then applying a passivation layer 46 having a plurality of openings 48 will complete the fabrication of one of the embodiments of the present invention. This embodiment is termed a homojunction trenched bipolar transistor structure 50. The passivation layer 46 of glass or like material protects the structure 50 from contamination. The plurality of openings 48 allow electrical connections to be made to the metal contacts 40, 42 and 44. The first step in fabricating the emitter metal contacts 40 is to prepare the emitter region 36 for metallization. This is accomplished by applying a photoresist to the emitter region 36 and exposing it to define an emitter pattern. The photoresist is then developed to produce the emitter pattern. Next, the emitter region 36 is etched, using the RIE process previously described, in those areas defined by the emitter pattern, thereby producing an emitter region 36' as shown. The remaining photoresist is then stripped. Likewise, the first step in fabricating the base metal contacts 42 is to prepare the base region 34 for metallization. This is accomplished by applying a photoresist to the base region 34 and exposing it to define a base pattern. The photoresist is then developed to produce the base pattern. The base region 34 is etched, using the RIE process, in those areas defined by the base pattern, thereby producing a base region 34' as shown. The remaining photoresist is stripped and the surfaces to be metallized of the emitter region 36', the base region 34' and the n++ collector ohmic contacts 28 are cleaned using a light etching process.

Referring now to FIG. 6 alone, the final steps in fabricating the emitter metal contacts 40, the base metal contacts 42 and the collector metal contacts 44 are accomplished by applying a photoresist to completely cover the top surface of the p-type silicon substrate 24, the n-type collector region 26, the n++ collector ohmic contacts 28, the base region 34' and the emitter region 36' including the trench 30. The photoresist is exposed to define a metallization pattern, and, then, developed to produce the metallization pattern. Aluminum is deposited in those areas defined by the metallization pattern, thereby producing the emitter metal contacts 40, the base metal contacts 42 and the collector metal contacts 44.

Still referring to FIG. 6, although the homojunction trenched bipolar transistor structure 50 is an improvement over the conventional homojunction SBT structure of FIG. 1, there is still one limitation that is common to all homojunction structures. The limitation is that the base region 34' must be doped with an impurity concentration much less than that of the emitter region 36' to ensure that the injection efficiency approaches unity. Also, in the homojunction trenched bipolar transistor structure 50, the base resistance between the base region 34' at the bottom of the trench 30 and the base metal contacts 42 can become unacceptably large for some applications. One way to reduce the base resistance is to increase the impurity dopant in the base region 34'. However, if the current gain is to be preserved with heavy doping of the base region 34', the emitter region 36 must be of a higher bandgap than the base region 34'. By virtue of the bandgap differential offset, carriers from the emitter region 36' can be efficiently injected into the base region 34'. Also, because of this same bandgap differential offset, the injection of carriers from the base region 34' back into the emitter region 36' are diminished. Thus, with the benefit of this heterojunction type of injection, the charge carriers will enter the base region 34' with appreciable velocity, the base transit time will be decreased, the minority charge carrier survival probability will be increased and the frequency/speed performance will be proportionately increased.

Referring again to FIGS. 5 and 6 as viewed concurrently, the major differences between the fabrication of the homojunction trenched bipolar transistor structure 50 and a -heterojunction trenched bipolar transistor structure 52 is in the growing of the emitter region 36 and doping of the base region 34. To implement the heterojunction trenched bipolar transistor structure 52, a pseudomorphic layer (emitter region 36) is grown over the base region 34, which has now been grown of p++ silicon to a thickness of about 500 Angstroms. The p++ silicon comprises boron, aluminum, gallium or indium doped silicon with a dopant concentration of $10^{19}$ atoms/cm$^3$ within the range of $10^{18}$ to $10^{20}$ atoms/cm$^3$. As previously mentioned, the preferred p-type dopant is boron. Because of the pseudomorphic layer (emitter region 36), about ten times more impurity dopant can be used here than in the homojunction trenched bipolar transistor structure 50. To continue, the pseudomorphic layer (emitter region 36) comprises a higher bandgap material such as n+ non-stoichiometric silicon carbide (SiC) of about 6.0 percent C in Si. This translates into seventeen (17) atomic layers of Si to one (1) atomic layer of C, which is written as $Si_{0.94}C_{0.06}$. The modified ALE method previously mentioned is used to grow the pseudomorphic layer (emitter region 36) to a predetermined thickness, which is inversely proportional to the percentage of carbon used in the compound. The $Si_{0.94}C_{0.06}$ grown will take on the lattice constant of the p++ silicon of the base region 34 so long as the total thickness of the pseudomorphic layer (emitter region 36) does not exceed the above-mentioned predetermined thickness, which is defined as the thickness beyond which the strain can no longer be accommodated in a defect free single crystal, and misfit dislocations begin to appear. For 6.0 percent C in Si, the predetermined thickness of the pseudomorphic layer (emitter region 36) limit is about 300 Angstroms. If the pseudomorphic layer (emitter region 36) is substantially less than 300 Angstroms, it cannot reliably be metallized without damaging it. Accordingly, in order to improve the conductivity of metallization of the pseudomorphic layer (emitter region 36), a second layer of n++ silicon (not shown) is deposited to a thickness typically of about 1000 Angstroms thereon. Thus, in the general case of fabrication of the heterojunction trenched bipolar transistor structure 52, the emitter region 36 comprises a pseudomorphic layer and a second layer of n++ silicon. The n++ silicon is formed by doping silicon with the same dopants, to the same concentration and within the same range as previously mentioned. Once the emitter region 36 is formed (FIG. 5), fabrication of the heterojunction trenched bipolar transistor structure 52 (FIG. 6) follows the process steps previously described in fabrication of the homojunction trenched bipolar transistor structure 50 (FIG. 6).

Continuing to refer to FIGS. 5 and 6 as viewed concurrently, other, i.e., nearly lattice-matched, heterojunction interfaces can be used to efficiently inject carriers from the emitter region 36 into the base region 34. One such example is that of gallium phosphide (GaP) on silicon. In this example, the GaP is grown as the pseudomorphic layer (emitter region 36). The GaP is grown by the ALE extraction/exchange method wherein gallium-containing reagent gases are alternated with phosphorous-containing reagent gases. To be effective, the higher bandgap material, i.e., the emitter region 36 material, must be pseudomorphic in nature, i.e., take on the lattice characteristic of the surface upon which it is grown, to preclude unwanted interface states and trapped charges and be below the critical thickness beyond which lattice mismatch stress can no longer be accommodated. Other such examples are gallium arsenide (GaAs) or zinc selenide (ZnSe) on germanium, boron nitride (BN) on diamond or gallium nitride (GaN) on SiC. In all of these cases, the base region 34 material and the higher bandgap pseudomorphic layer (emitter region 36) material are deposited by the ALE extraction/exchange method so as to maintain the required uniformity in thickness.

As shown in FIG. 6, the homojunction and heterojunction trenched bipolar transistor structures 50 and 52, respectively, feature the emitter region 36 up. However, an inverted structure wherein the collector region 26 is up is contemplated as an embodiment of the present invention. The inverted structure has certain advantages for obtaining a higher gain bandwidth product in microwave power applications. The trench 30 having a rectilinear form, in the dimensions of depths to widths previously mentioned, is considered the most desirable configuration; however, other rectilinear forms, curvilinear forms or combinations thereof are contemplated as embodiments of the present invention. Also, rather than be in pairs, as depicted in the cross-section view of FIG. 6, the collector ohmic contacts 28 and the silicon dioxide areas 38 can be continuous and encircle the trench 30.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An improved bipolar transistor structure wherein its volume is better utilized to substantially eliminate unwanted parasitic capacitance comprising:
   a substrate of a first semiconductor material;
   a collector region of a second semiconductor material fashioned upon said substrate;
   collector ohmic contacts of a third semiconductor material fashioned upon said collector region;
   a trench formed into said collector region between said collector ohmic contacts to provide a trenched growth surface;
   a base region of a fourth semiconductor material being grown uniformly within one atomic layer to a first thickness contiguously upon, said collector region, and upon and within said trench onto said trenched growth surface such that the uniformity of said first thickness of said base region is independent of the crystallographic orientation of said trenched growth surface;
   an emitter region of a fifth semiconductor material being grown uniformly within one atomic layer to a second thickness contiguously upon said base region such that the uniformity of said second thickness of said emitter region is independent of the crystallographic orientation of said base region; and
   emitter, base and collector metal contacts fashioned upon said emitter region, said base region and said collector ohmic contacts of said collector region, respectively, for providing electrical connections thereto.

2. The improved bipolar transistor structure of claim 1 further including silicon dioxide areas being fashioned upon and into said collector region between said collector ohmic contacts and said base region so as to further eliminate said unwanted parasitic capacitance.

3. The improved bipolar transistor structure of claim 2 wherein said first semiconductor material comprises silicon being doped with a dopant selected from the group consisting of boron, aluminum, gallium and indium to form p silicon having a dopant concentration of about $10^{14}$ atoms/cm$^3$ within the range of $10^{13}$ to $10^{16}$ atoms/cm$^3$.

4. The improved bipolar transistor structure of claim 3 wherein said second semiconductor material comprises silicon being doped with a dopant selected from the group consisting of phosphorus, arsenic and antimony to form n silicon having a dopant concentration of about $5 \times 10^{17}$ atoms/cm$^3$ within the range of $10^{16}$ to $10^{18}$ atoms/cm$^3$.

5. The improved bipolar transistor structure of claim 4 wherein said third semiconductor material comprises silicon being doped with a dopant selected from the group consisting of phosphorus, arsenic and antimony to form n++ silicon having a dopant concentration of about $10^{20}$ atoms/cm$^3$ within the range of $3 \times 10^{19}$ to $10^{21}$ atoms/cm$^3$.

6. The improved bipolar transistor structure of claim 5 wherein said base region and said emitter region consist of semiconductor materials having substantially the same chemical composition except for doping, thereby creating an improved homojunction trenched bipolar transistor structure.

7. The improved homojunction trenched bipolar transistor structure of claim 6 wherein said fourth semiconductor material comprises silicon being doped with a dopant selected from the group consisting of boron, aluminum, gallium and indium to form p+ silicon having a dopant concentration of about $10^{18}$ atoms/cm$^3$ within the range of $10^{17}$ to $10^{19}$ atoms/cm$^3$.

8. The improved homojunction trenched bipolar transistor structure of claim 7 wherein said fifth semiconductor material comprises silicon being doped with a dopant selected from the group consisting of phosphorus, arsenic and antimony to form n++ silicon having a dopant concentration of about $10^{20}$ atoms/cm$^3$ within the range of $10^{19}$ to $10^{21}$ atoms/cm$^3$.

9. The improved bipolar transistor structure of claim 1 wherein said trench is rectilinear in form.

10. The improved bipolar transistor structure of claim 1 wherein said trench is curvilinear in form.

11. The improved bipolar transistor structure of claim 1 wherein said trench is both rectilinear and curvilinear in form.

12. The improved bipolar transistor structure of claim 9 wherein said trench of rectilinear form is configured within a depth of 5.0 to 10.0 microns and a width of 1.0 to 2.0 microns.

13. The improved bipolar transistor structure of claim 5 wherein said base region and said emitter region consist of semiconductor materials having different chemical compositions, thereby creating an improved heterojunction trenched bipolar transistor structure.

14. The improved heterojunction trenched bipolar transistor structure of claim 13 wherein said fourth semiconductor material comprises silicon being doped with a dopant selected from the group consisting of boron, aluminum, gallium and indium to form p++ silicon having a dopant concentration of about $10^{19}$ atoms/cm$^3$ within the range of $10^{18}$ to $10^{20}$ atoms/cm$^3$.

15. The improved heterojunction trenched bipolar transistor structure of claim 14 wherein said fifth semiconductor material comprises a higher bandgap material of n+ non-stoichiometric silicon carbide, and said emitter region thereby comprising a pseudomorphic layer.

16. The improved heterojunction trenched bipolar transistor structure of claim 15 wherein said n+ non-stoichiometric silicon carbide comprises about 6.0 percent carbon in silicon.

17. The improved heterojunction trenched bipolar transistor of claim 14 wherein said emitter region of said fifth semiconductor material is selected from the group consisting of gallium phosphide, gallium arsenide or zinc selenide, boron nitride, and gallium nitride; and wherein said base region of said fourth semiconductor material is selected from a corresponding group consisting of silicon, germanium, diamond, and silicon carbide, respectively.

18. The improved heterojunction trenched bipolar transistor structure of claim 15 wherein said emitter region includes a sixth semiconductor material being grown uniformly within one atomic layer to a third thickness contiguously upon said pseudomorphic layer thereby forming a second layer of semiconductor material.

19. The improved heterojunction trenched bipolar transistor structure of claim 18 wherein said sixth semiconductor material comprises silicon being doped with a dopant selected from the group consisting of phosphorus, arsenic and antimony to form n++ silicon having a dopant concentration of about $10^{20}$ atoms/cm$^3$ within the range of $10^{19}$ to $10^{21}$ atoms/cm$^3$.

* * * * *